United States Patent
Lo et al.

(10) Patent No.: US 7,695,873 B2
(45) Date of Patent: Apr. 13, 2010

(54) METHOD AND APPARATUS FOR PRODUCING COLOR FILTER WITH A LINE-SCAN EXPOSURE TECHNOLOGY BY HIGH-SPEED SHUTTER CONTROL

(75) Inventors: Yu-Cheng Lo, Taipei (TW); Huai-An Li, Tao-Yuan (TW); Feng-Lin Hsu, Taipei (TW)

(73) Assignee: Chungwa Picture Tubes, Ltd., Taipei (TW)

( * ) Notice: Subject to any disclaimer, the term of this patent is extended or adjusted under 35 U.S.C. 154(b) by 1296 days.

(21) Appl. No.: 11/187,825

(22) Filed: Jul. 25, 2005

(65) Prior Publication Data

US 2006/0194127 A1 Aug. 31, 2006

(30) Foreign Application Priority Data

Feb. 25, 2005 (TW) .............................. 94105749 A

(51) Int. Cl.
*G02B 5/20* (2006.01)
(52) U.S. Cl. .......................................................... 430/7
(58) Field of Classification Search ........................ None
See application file for complete search history.

(56) References Cited

U.S. PATENT DOCUMENTS

2003/0169502 A1* 9/2003 Ogura .......................... 359/618
2005/0001895 A1* 1/2005 Uemura et al. .............. 347/235

FOREIGN PATENT DOCUMENTS

JP           9-073171 A    *   3/1997
JP        2004-252375 A    *   9/2004

OTHER PUBLICATIONS

Computer-generated translation of JP 2004-252375 (Sep. 2004).*
Computer-generated translation of JP 9-073171(Mar. 1997).*

* cited by examiner

*Primary Examiner*—John A. McPherson
(74) *Attorney, Agent, or Firm*—Stout, Uxa, Buyan & Mullins, LLP

(57) ABSTRACT

A method and apparatus for producing a color filter is disclosed. It mainly uses an exposure apparatus which can produce a plurality of exposure light sources to do an exposure process. Through fast controlling the on/off time of the plurality of exposure light sources as well as making a relative moving between the plurality of exposure light sources and a substrate plane, a color photoresist layer on the substrate plane can be exposed to form a pattern thereon, wherein the on/off time of the exposure light sources are respectively controlled by a plurality of shutters of the exposure apparatus. Then, with a developing process to the exposed color photoresist layer, a color layer is formed on the substrate plane. The main advantage of the invention is that photo-mask is not needed in the exposure process and any size substrate plane can be handled by the present exposure apparatus.

24 Claims, 12 Drawing Sheets

METHOD AND APPARATUS FOR PRODUCING COLOR FILTER WITH A LINE-SCAN EXPOSURE TECHNOLOGY BY HIGH-SPEED SHUTTER CONTROL

FIELD OF THE INVENTION

The present invention generally relates to a method and apparatus for fabricating a color filter, and more particularly to a line scanning technology of a high-speed shutter controlling the exposing time for a method and apparatus for fabricating the color filter.

DESCRIPTION OF THE PRIOR ART

The color filer plays an important role in a liquid crystal display which can display various color images. The color filter is a coloration layer with primary color such as red, green, and blue, or an arrangement corresponding to each pixel of a colored multiple dyeing elements. At present, the fabricating method for the color filter is except for the glue adhering, in addition to the coloration layer with different colors is formed on the substrate by the photolithography process. In the conventional technology, the color filter is formed by dye-dispersing process. As shown in FIG. 1A, firstly, a substrate plane 102 is provided, and the substrate plane 102 has a black matrix 104 thereon, which used to block the light. Then, as shown in FIG. 1B, a coloration photoresist layer is spun on the substrate plane 102 and the block matrix 104 to form a red coloration photoresist layer 106. Next, a photolithography process used a mask 108 to expose the layer of red coloration photoresist 106. Therefore, the required exposing portion is formed color area during the exposing process. Then, a development process is performed to the layer of red coloration photoresist 106 after the exposing process. The portion of unexposed red coloration photoresist layer is dissolved by etching solution, and a desired red color layer 1062 can be appeared as shown in FIG. 1D. Next, another coloration layer is repeatedly formed on the substrate plane 102.

Referring to FIG. 2A, another color photoresist, such as green coloration photoresist 110 is spun on the substrate plane 102, the block matrix, and the red color layer 1062 which is formed before. Then, the mask 112 used to expose the green coloration photoresist layer 10. Due to the green coloration photoresist layer 110 is a negative photoresist, thus, the exposing process utilized the exposed mask with the desired pattern of the coloration layer, as shown in FIG. 2B. At this time, the unexposed portion layer of the green coloration photoresist layer 110 is dissolved by the etching solution, and the desired layer of the green coloration 1102 is formed on the substrate plane 102, as shown in FIG. 2C. According to abovementioned, the red coloration layer 1062 and the green coloration layer 1102 have the same fabricating processes. Similarly, referring to FIG. 3 shows the blue coloration layer 114 that is also formed on the substrate plane 102 by using the same fabricating process as abovementioned. Thus, the formation of the primary coloration layer of the color filter is accomplished.

According to above fabricating process, the red, green, and the blue coloration photoresist layers required three processes, such as spinning on, exposing, and developing. Thus, the design and the maintenance for the mask are very important. However, there are many drawbacks for forming the color filter by using mask. The drawback such as the budget of the design and the new mask fabrication is very expansive, the mask would be damaged easily during the color filter process, and the maintenance is very difficult in subsequently production line, and a single mask only corresponds to a substrate plane, thus, the mask is to be re-designed to apply the new substrate plane.

SUMMARY OF THE INVENTION

It is an object of the present invention is that providing a method and an apparatus for fabricating color filter, wherein the exposing process of the fabricating method without using the mask to expose the coloration photoresist to form the desired pattern.

It is an object of the present invention is that the exposure scanner can generate a plurality of exposing lights, and the high speed controlling shutter used to control the ON/OFF time of the plurality of exposing lights to generate the relative motion between the plurality of exposing lights and a substrate plane to scan the one of the coloration photoresist layer on the substrate plane. Thus, the fabrication processes do not use the mask, and further the budget of the mask fabrication can be diminished, and the damage also can be prevented.

It is another object of the present invention is to provide a method and apparatus for fabricating color filter without using a mask to perform exposing process, and further, the substrate plane using appropriated program operating to fabricate the many different color filters size.

It is another object of the present invention is to provide a simple operating process and the process can be executed automatically for a method and apparatus for fabricating color filter.

According to abovementioned objects, the present invention provides a method and a apparatus for fabricating a color filter which utilize an exposing scanner to generate a plurality of exposing light, and control the ON/OFF time of the plurality of the light exposing lights in high speed to generate a relative motion between the plurality of exposing light and the substrate plane, such that an exposing operation is performed on the coloration photoresist layer over the substrate plane for forming a required patterns. Wherein the ON/OFF time of the plurality of exposing lights is controlled that corresponding to each plurality of shutter switches respectively. Then, the coloration photoresist layer is performed a development process to form a desired coloration layer on the substrate plane after exposing process, wherein the coloration layer can consist a set of the single color pixel. Similarly, above processes are repeated to obtain the various coloration layers. That is to say that the multiple color pixels are formed on the substrate plane. The advantage of the present invention is that the fabricating process without using mask during the exposing process. Furthermore, the different substrate plane size can be formed by exposure scanner in cooperated with the operating control

BRIEF DESCRIPTION OF THE DRAWINGS

The merits and advantages of the present invention compared with the prior art will be more easily presented by referring to the following diagrams and comparison of embodiments, in which.

DESCRIPTION OF THE PREFERRED EMBODIMENT

Figure 1A:
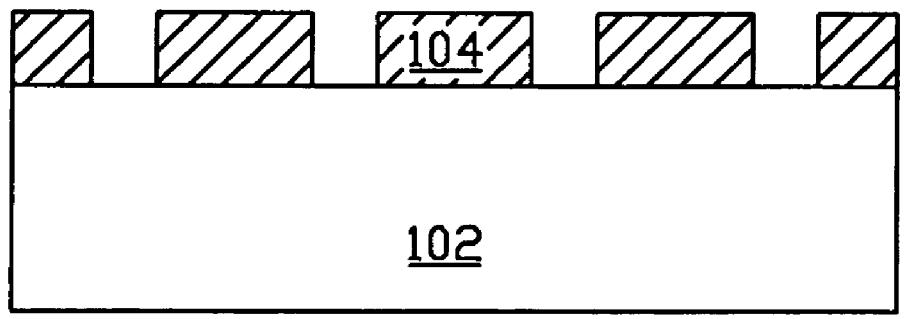
FIG. 1 to FIG. 3 is a flow diagram for fabricating a color filter in accordance with a conventional prior art.
Figure 1B:
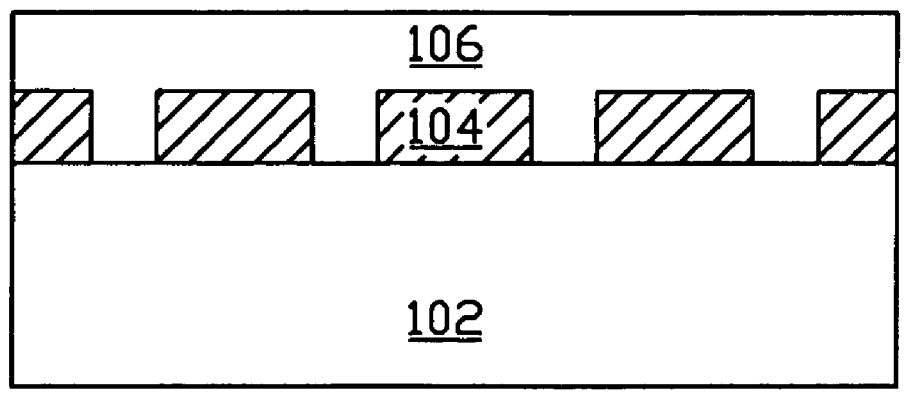
Figure 1C:
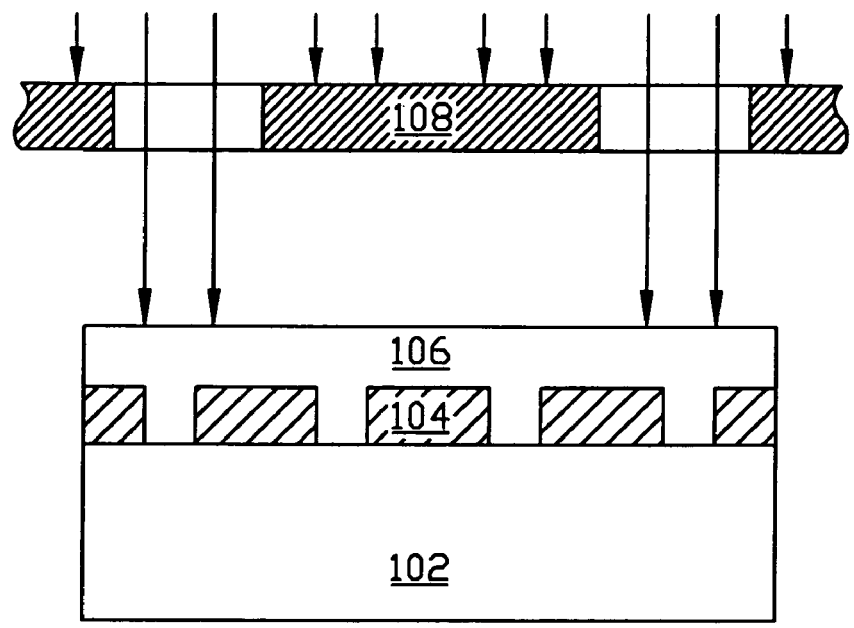
Figure 1D:
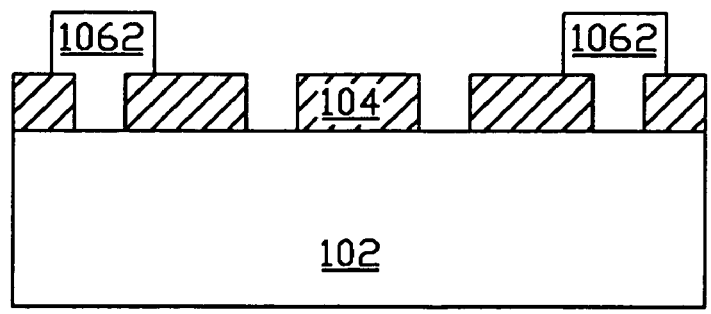
Figure 2A:
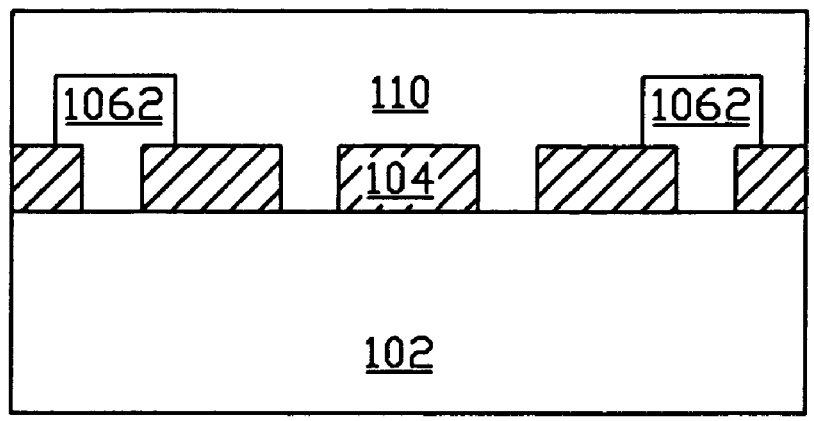
Figure 2B:
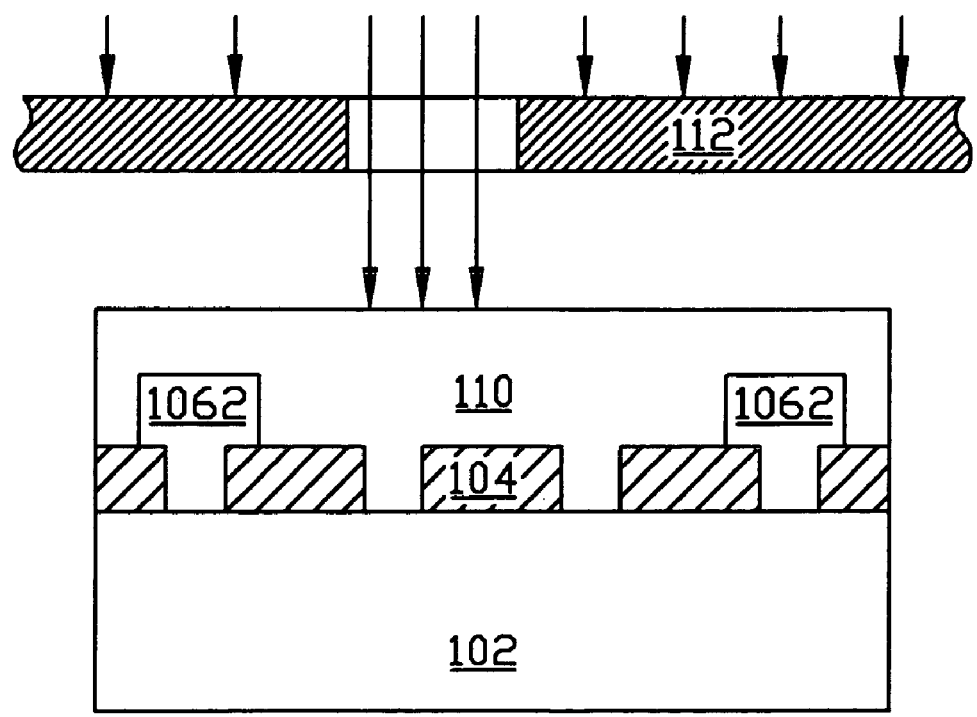
Figure 2C:
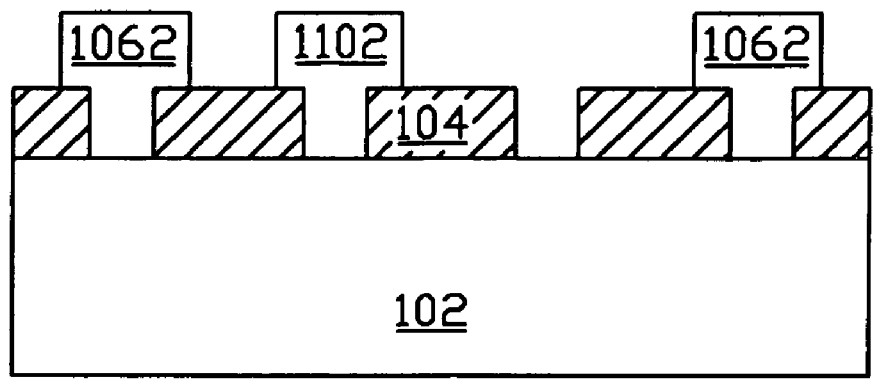
Figure 3:
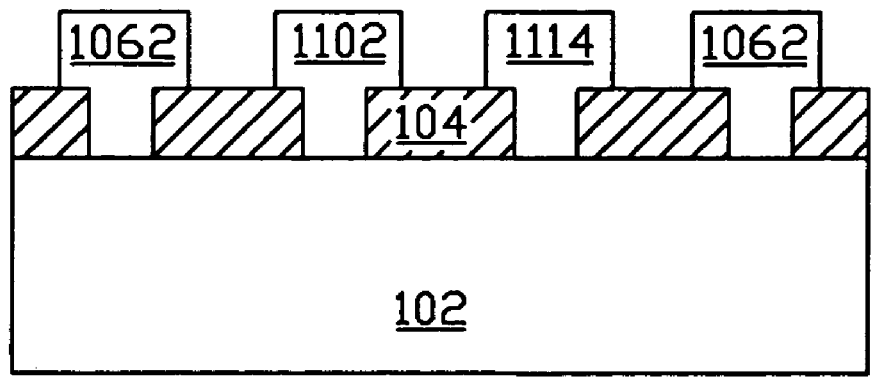
Figure 4:
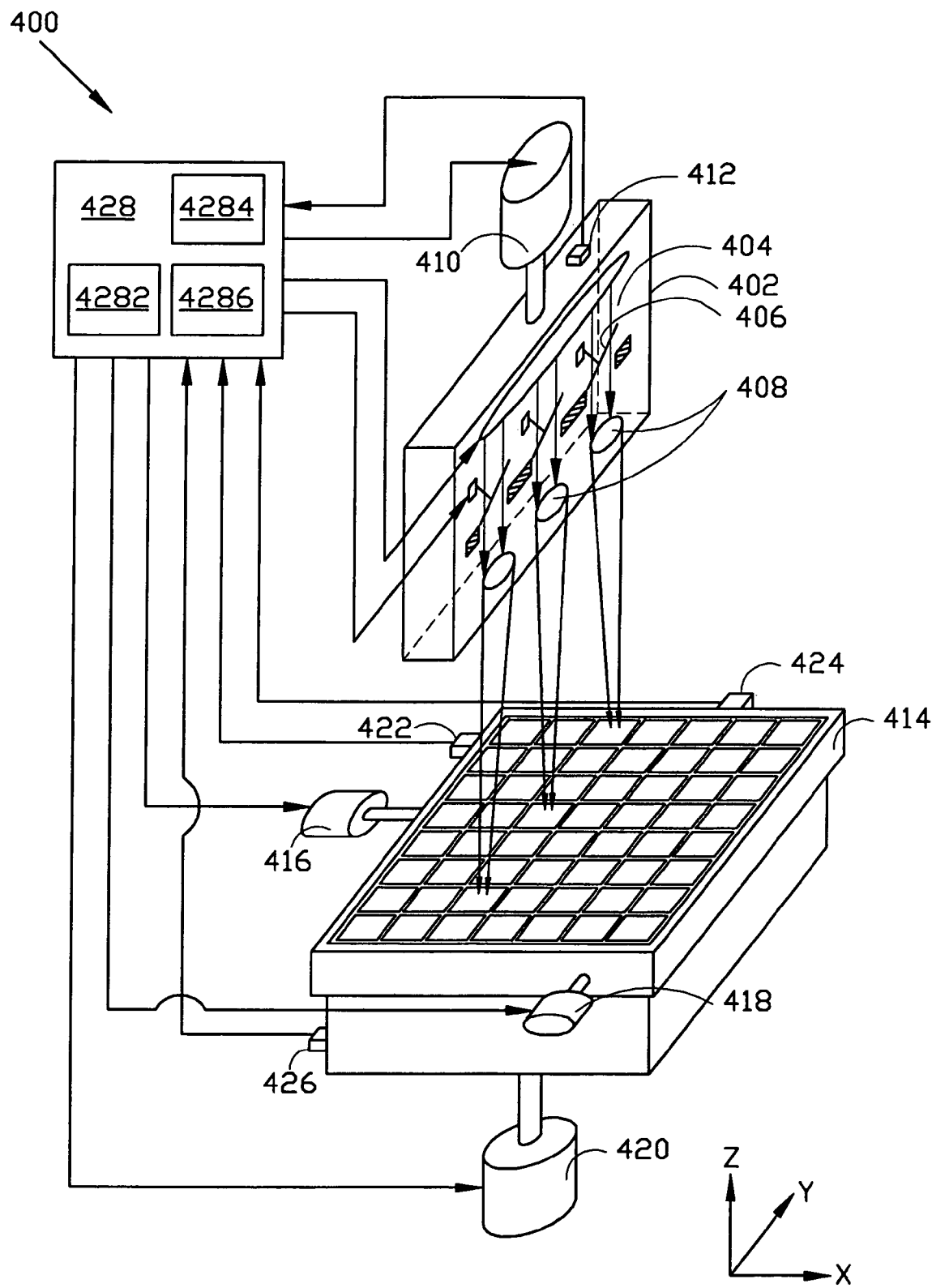
FIG. 4 is a diagram for showing an apparatus for fabricating a color filter in accordance with the present invention disclosed herein.

The present invention discloses a method and an apparatus for fabricating a color filter. FIG. 4 is a diagram for showing an apparatus for fabricating the color filter of the preferred embodiment of the present invention. The apparatus includes an exposure scanner 402 with a light source 404, such as UV light (ultraviolet light), used to generate the exposing light source with a desired wavelength, a plurality of shutter switches 408 used to control the light source 404 to generate the plurality of light sources, and the plurality of lens 408 used to focus the plurality of light sources that passes through the exposure scanner 402, so as to form a plurality of exposing light sources, wherein the plurality of exposure light sources arranged a row type within the exposure scanner 402, and the distance between the each plurality of exposure light sources is constant as shown in FIG. 4. A rotating motor 410 used to drive the exposure scanner 402 to perform a rotating motion, and a rotating position sensor 412 used to sense the rotating displacement of the exposure scanner 402.

Furthermore, the color filter fabricating apparatus 400 also includes a platform 414 which used to load a substrate plane for forming a color filter, an X axis motor 416 used to shift the platform 414 in X axis, an Y axis motor 418 used to shift the platform in Y axis, and an Z axis motor 420 used to shift the platform in Z axis. X axis position sensor 422, Y axis position sensor 424, and Z axis position sensor 426 sense the motion of platform 414 in X axis, Y axis, and Z axis respectively, wherein the direction of X axis, Y axis, and Z axis are perpendicular to each other, and the spread plane surfaces of X axis direction and Y axis direction are parallel to a load surface of the platform 414.

Moreover, the row is consisted of the plurality of exposure light sources that is perpendicular to X axis direction, and a controller 428 received a position feedback signal from the each position sensors, wherein the controller 428 includes a motor controller 4282, the light source controller 4284, and a shutter controller 4286 which used to control the rotating motor 410, X axis motor 416, Y axis motor 418, and Z axis motor 420, light source 404, and the shutter switch 406 respectively. The controller 428 can show as a controller card or IC controller chip, or show as software such as program code within a microprocessor. All motors of the present invention used to generate the relative motion such as rotation, and shift up and down, and left and right sides between the exposure scanner 402 and the platform 414.

Thus, in a preferred embodiment of the present invention, the rotating motor 410 connected with the exposure scanner 402 to provide a rotating motion for the platform 414. Therefore, the relative motion also can be generated between the exposure scanner 402 and the platform 414. In another embodiment, the exposure scanner 402 also connected with X axis motor 416, Y axis motor 418, Z axis motor 420, and the rotating motor 410 which used to provide the shift in X axis direction, Y axis direction, and X axis direction, and in rotating direction, so as to perform a relative motion between the exposure scanner 402 and the platform 414.

Figure 5:
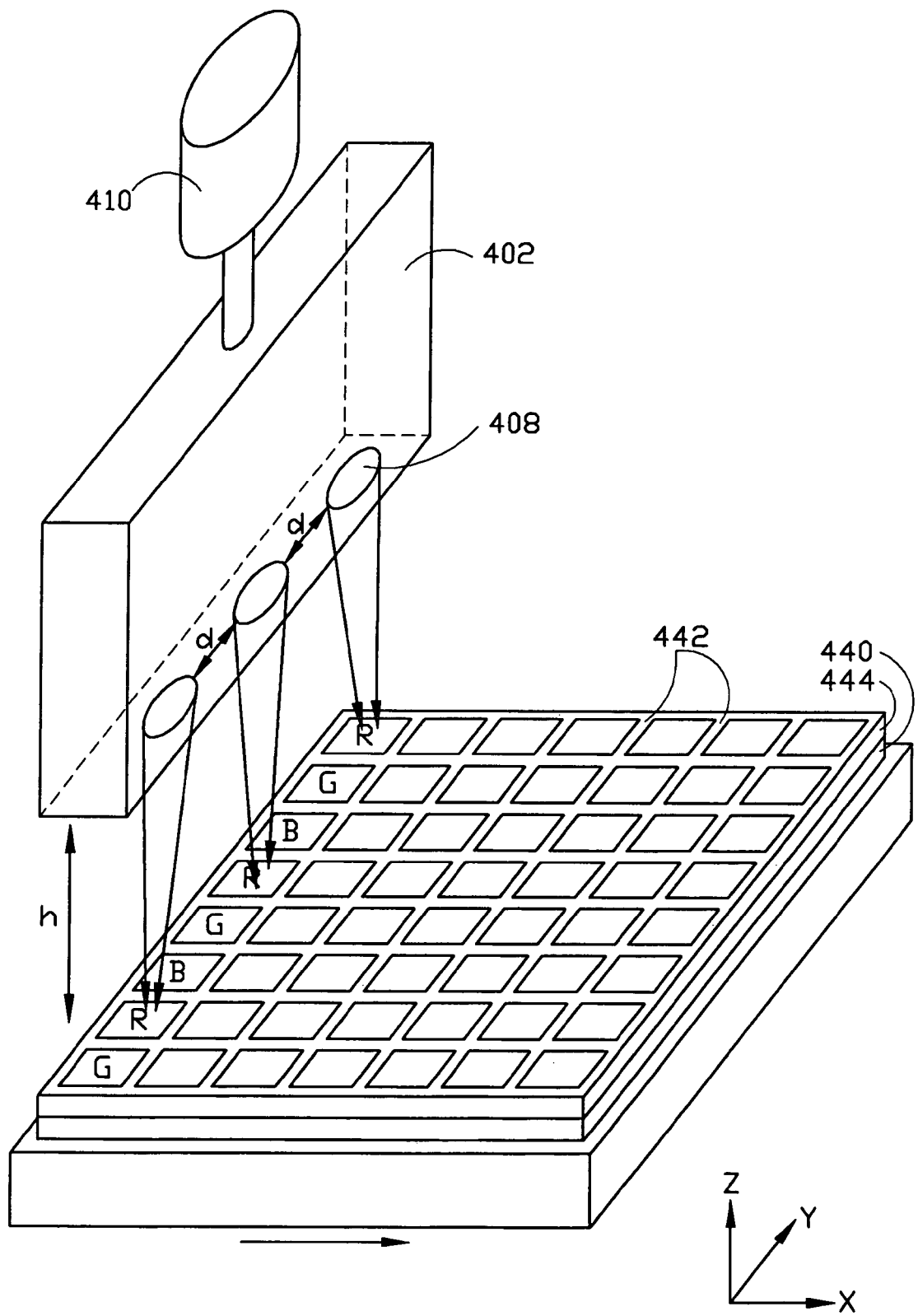
FIG. 5 is a schematic for showing the exposing operation of the exposing scanner of the FIG. 4 in accordance with the present invention disclosed herein.

FIG. 5 is a diagram of the FIG. 4 for showing the operation of the exposure scanner. As shown in FIG. 5, a layer of coloration photoresist is spun on the color filter, for example, s substrate plane 440 having a red coloration photoresist layer 444 thereon, and is placed on the platform 414. The substrate plane 440 has the black matrix (BM) 442 thereon. Then, an exposure process is performed on the red coloration photoresist layer 44. Firstly, the controller 428 controlled X axis motor 416, such that the platform 414 moved toward X axis, wherein X axis direction is a scanning direction for exposure scanner 402 to the platform 414. At the same time, the controller 428 controlled the shutter switch 406 to perform high speed I/O action, and further the ON/OFF time of the plurality of exposure light sources is controlled to emit from the plurality of lens 408. Accordingly, the plurality of exposure light sources of the exposure scanner 402 performed a line scan operation on the red coloration photoresist layer 444 which is over on the substrate plane 440.

Figure 6:
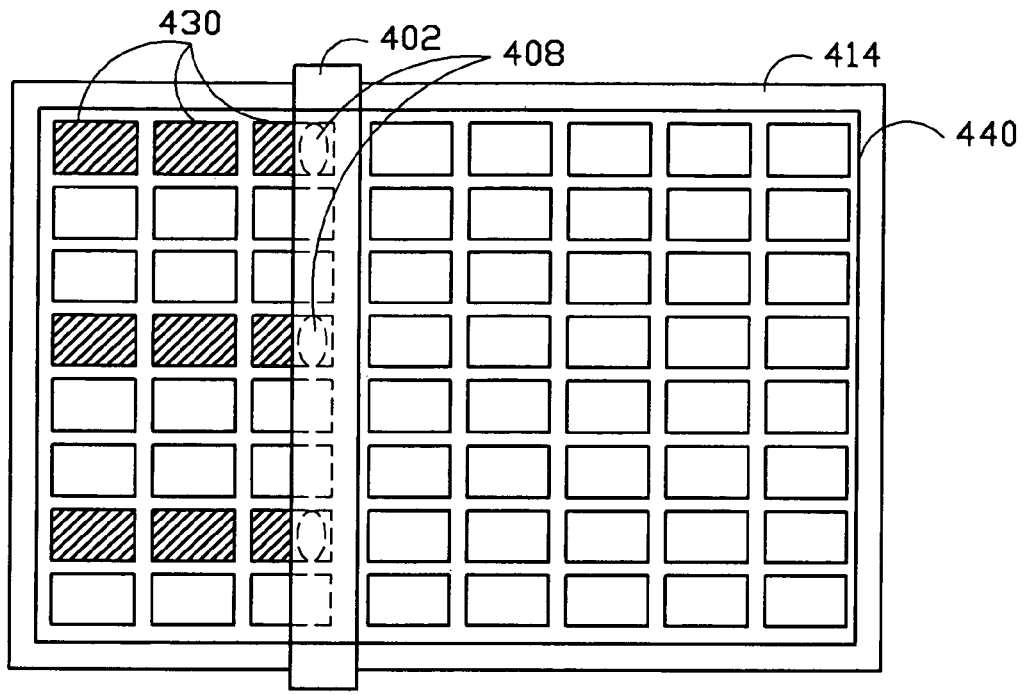
FIG. 6 is a top view for showing the line scanning exposing operation and the exposure area in accordance with the present invention disclosed herein.
Figure 7:
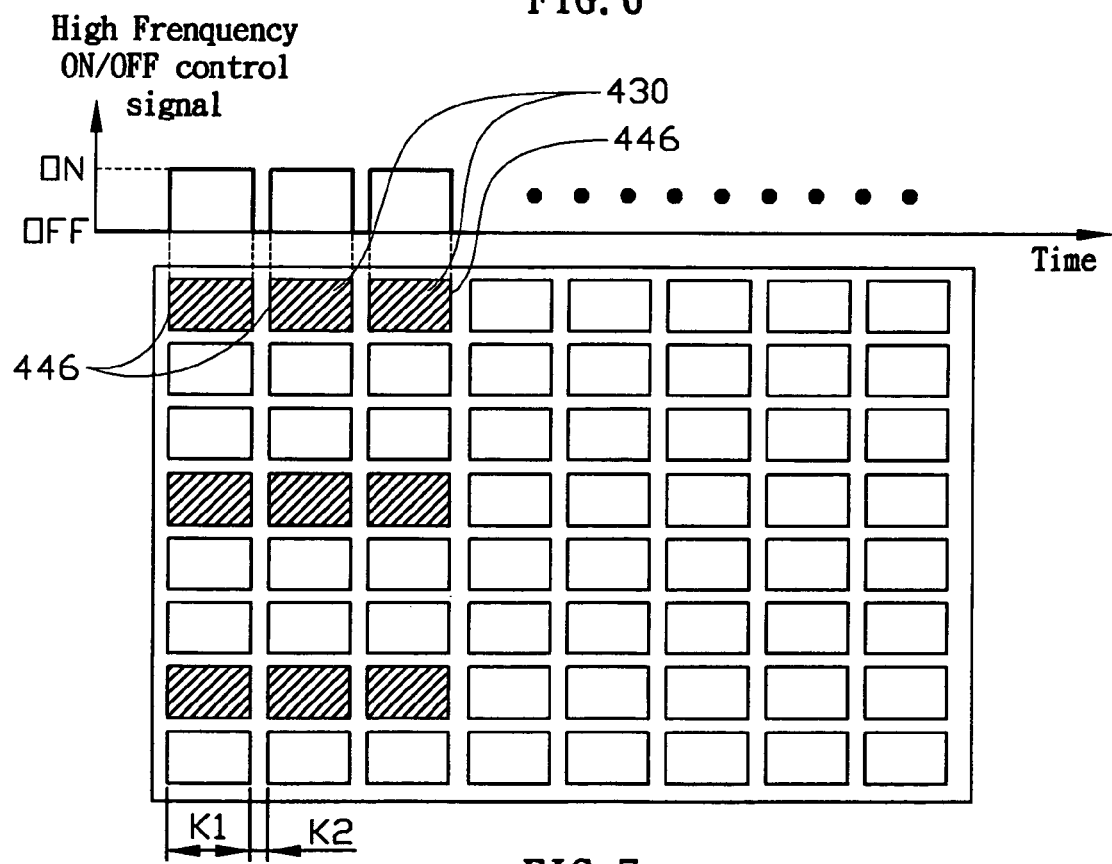
FIG. 7 is a schematic for showing the exposure area of the FIG. 6 corresponding to a high frequency ON/OFF controlling signal in accordance with the present invention disclosed herein.

FIG. 6 shows the exposure light source that is located on the exposure area 430 (the shade section) of the red coloration photoresist layer 444 during the line scan operation. The high speed switch control of the shutter switch 406 can generate a high frequency ON/OFF controlling signal by controller 428 to drive the shutter switch 406. FIG. 7 shows the operation diagram for the exposure area of the FIG. 6 that corresponds to the high frequency ON/OFF controlling signal waves. When the high frequency ON/OFF controlling signals is ON, and the shutter switching would be turned on, such that the UV light source can pass through the plurality of lens 408 to generate the exposure light source. At this time, the exposure light source is in the turn on status. Similarly, when the high frequency ON/OFF controlling signal is off, the shutter switch 406 would be turned off. Thus, the exposure light source is in the turn off status, when the UV light source cannot pass through the shutter switch 406.

Accordingly, when the signal is on, the exposure scanner 402 would be generated the exposure light source to perform the exposing process to the red coloration photoresist layer 444, so as to the exposure area 430 is generated as shown in FIG. 7. On the contrary, when the signal is off, the exposure scanner 402 stopped exposing the red coloration photoresist layer 444, as shown a un-exposure area 446 in the figure. Therefore, the ON/OFF time of the exposure light source can be controlled through the controller 428 that design the wave of the control high frequency ON/OFF controlling signal. Moreover, the length k1 of exposure area 430 per each exposure area unit and the width k2 of the un-exposure area 446 can be adjusted by controlling the shift scanning speed on X axis of the platform 414, or controlling the ON/OFF time of the high frequency ON/OFF control signal. After performing the line scanning for the red coloration photoresist layer 444, the development process is performed to the red coloration photoresist layer 444 to form a red coloration layer on the substrate plane 440. Then, a green coloration photoresist layer is spun over the substrate plane 440, the black matrix 442, and the red coloration layer to form a green coloration layer.

Figure 8:
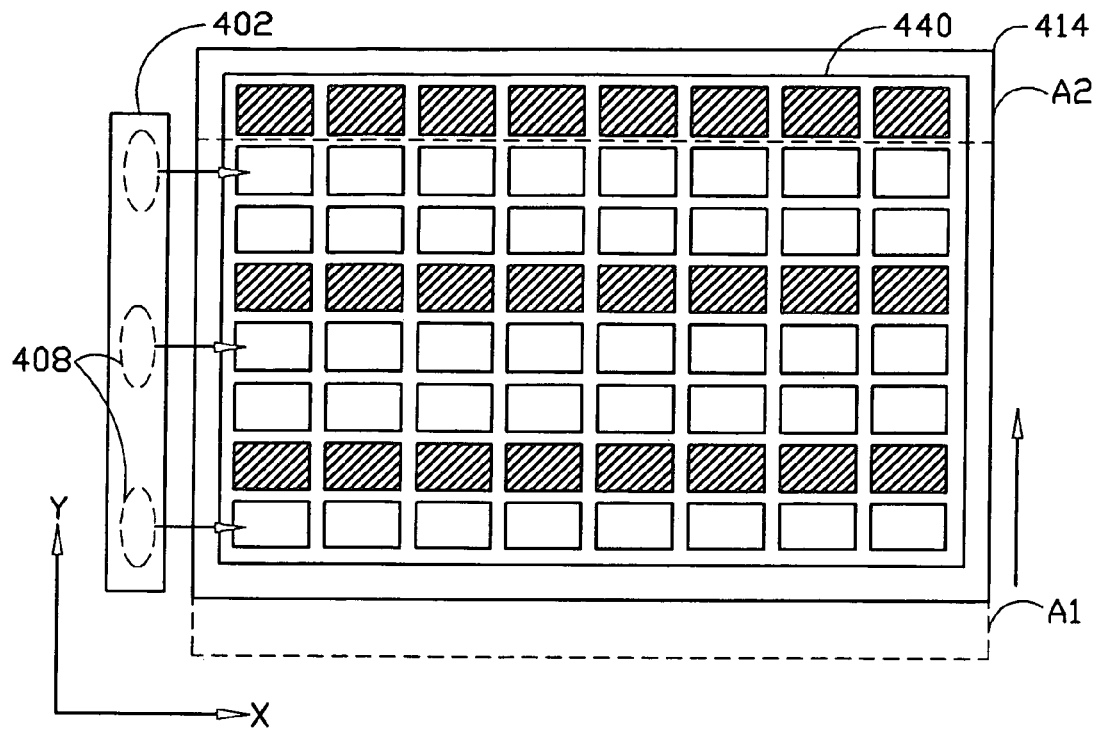
FIG. 8 is a schematic for showing the motion of Y axis of a platform in accordance with the present invention disclosed herein.

Next, a controlling signal is transferred to Y axis motor 418 from the controller 428, such that the platform 414 performed a shit in Y axis direction, so as to change the relative position between the exposure scanner 402 and the platform 414 in Y axis direction. As shown in FIG. 8, Y axis motor 418 drives the platform 414 to perform a motion in Y axis direction, such that the platform 414 moved toward to the next Y axis direction A2 (real line) from the original Y axis direction A1, wherein the original Y axis direction A1 (dotted line) is a position that the red coloration photoresist layer 44 is scanned previously. Thus, the exposure scanner 402 starts to perform the line scan in X axis direction of the green coloration photoresist layer. Then, the exposure and the developing process for forming the red coloration layer are repeated, so that the green coloration layer can be obtained on the substrate plane 440. Similarly, after the green coloration layer is finished, a blue coloration photoresist layer is spun on the substrate plane 440, black matrix 442, red coloration layer, and green coloration layer. Then, a blue coloration layer can be obtained by repeating the shift in Y axis direction of the green coloration layer, exposing and the developing process. Thus, a color filter having three coloration layers are accomplished.

Figure 9:
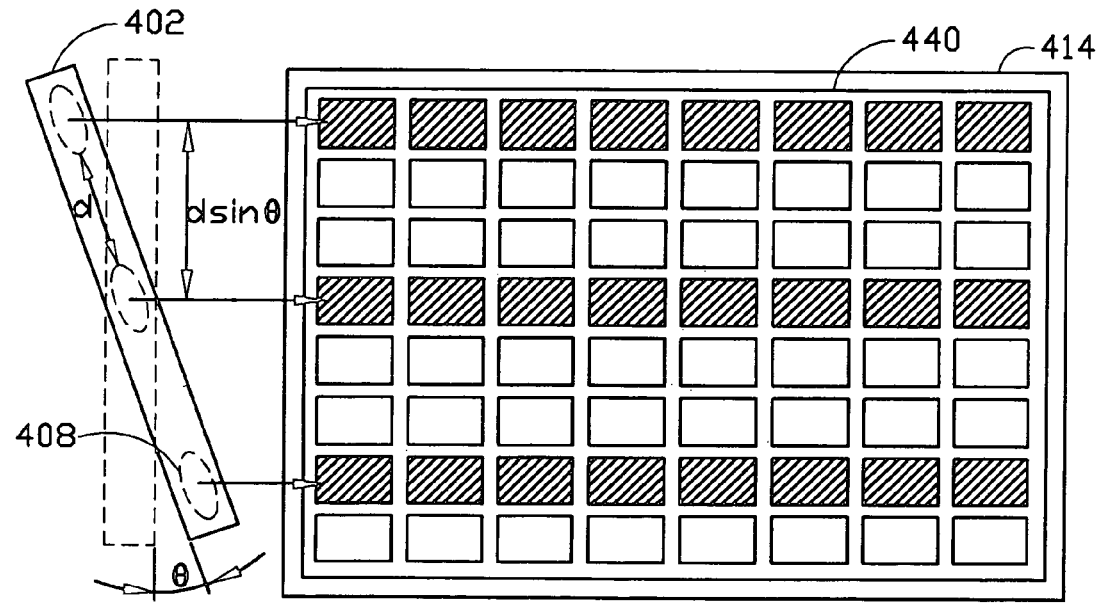
FIG. 9 is a schematic representation a rotating motion of the exposing scanner in accordance with the present invention disclosed herein.

Furthermore, the color filter fabricating apparatus of the present invention can process the different substrate plane size. Owing to the rotating motor 410 can make the exposure scanner 402 rotation. Thus, as shown in FIG. 9, when the controller 428 transmitted a controlling signal to drive the rotating motor 402, such that the exposure scanner 402 rotated an angle θ from the position that is paralleled to the frame of the substrate plane 440, at this time, a line scan exposing operation is performed on the coloration photoresist layer. So that, the interval width of the exposure area of the coloration photoresist layer is changed from the d to the d*sin θ, that is to say, the interval width is reduced. On the other hand, the rotating motor 402 can rotate the exposure scanner 402 to make the projection of the intervals d between the two exposure light source in Y axis direction is equal to the required distance of the each exposure area lines. By adjusting the rotating angle θ of the exposure scanner 402, the intervals of the each line of the exposure area can be adjusted to apply the different substrate plane size. Due to the exposure scanner 402 is rotating, the projection intervals d*sin θ of the two exposure lights in Y axis is smaller than original intervals d which is not rotating. Thus, the intervals d can be designed as a maximum to cover the all substrate plane size.

Figure 10:
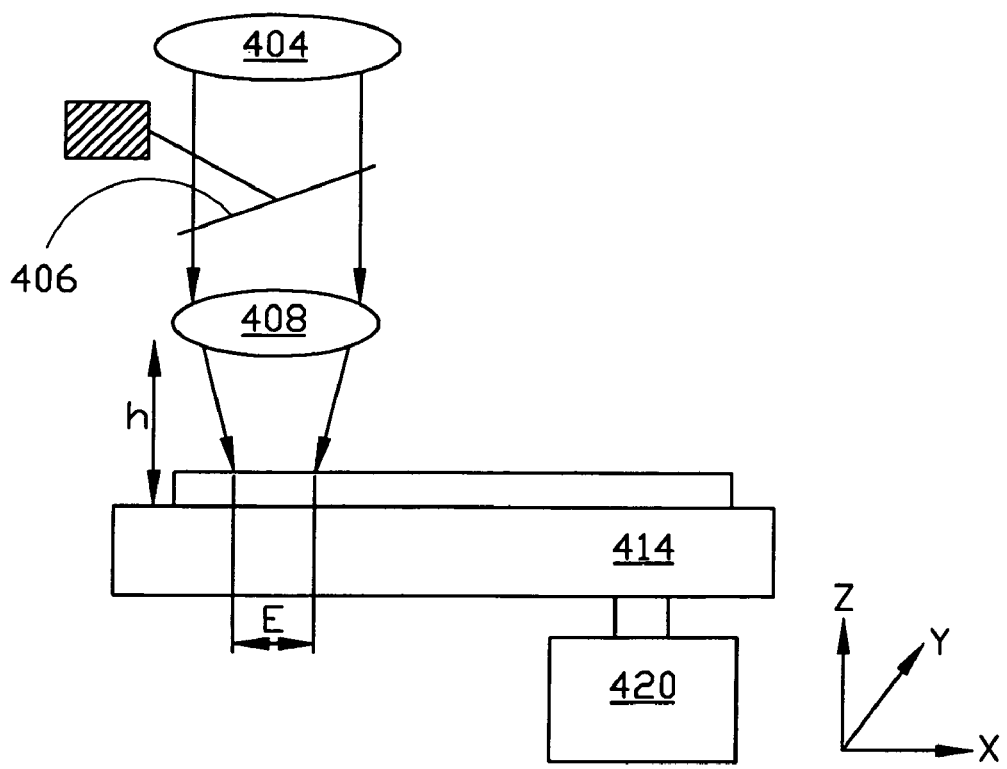
FIG. 10 is a schematic representation the relationship diagram between the motion of Z axis of the platform and the exposing range of the exposing light source in accordance with the present invention disclosed herein.
Figure 11A:
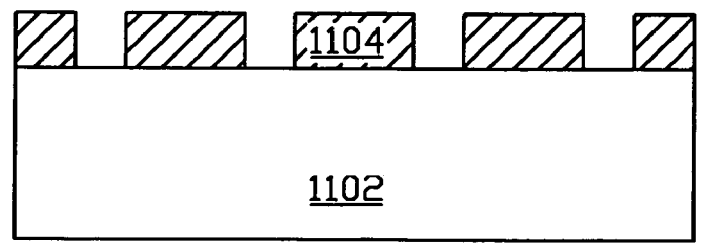
FIG. 11A to FIG. 11F are schematic representation the steps for fabricating the color filters in accordance with the method disclosed herein.
Figure 11B:
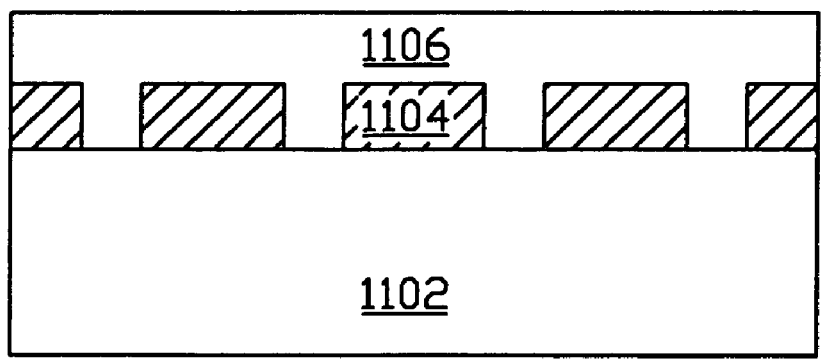
Figure 11C:
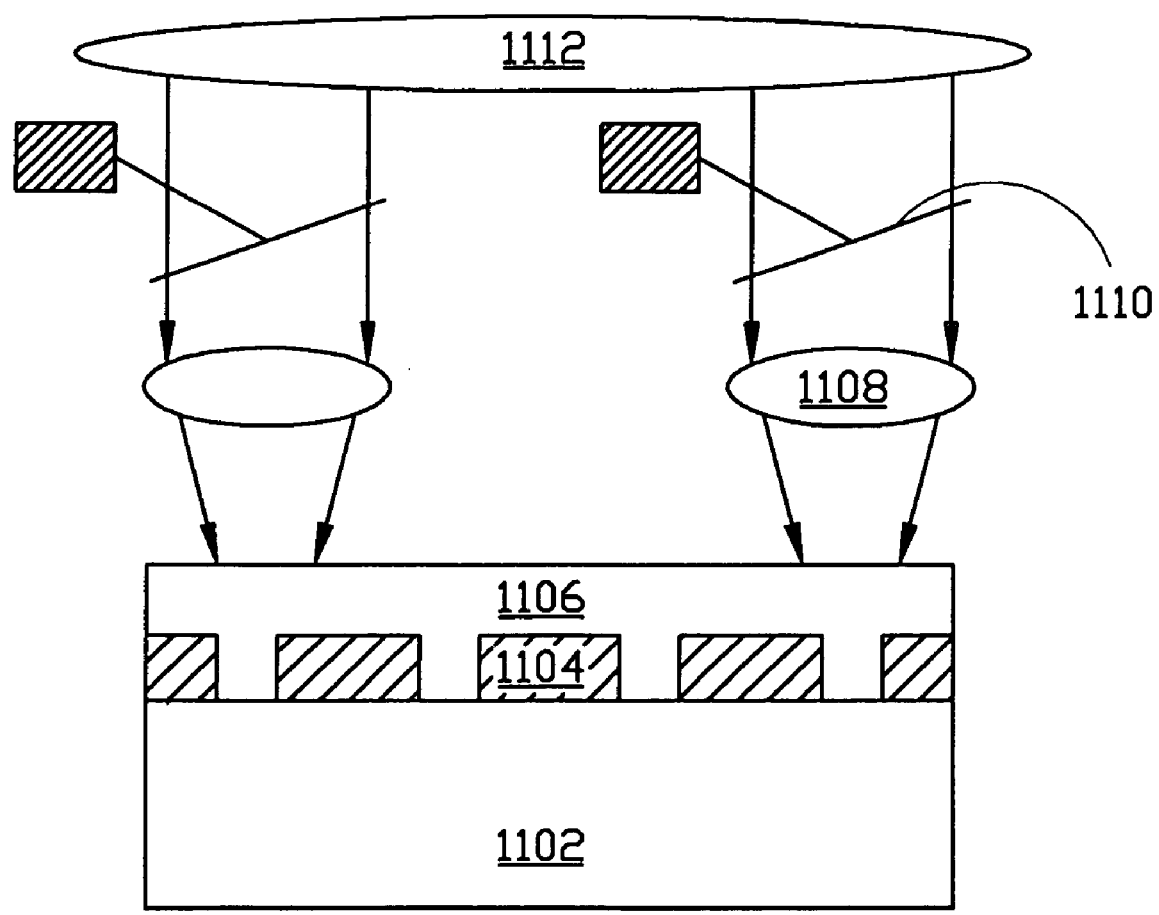
Figure 11D:
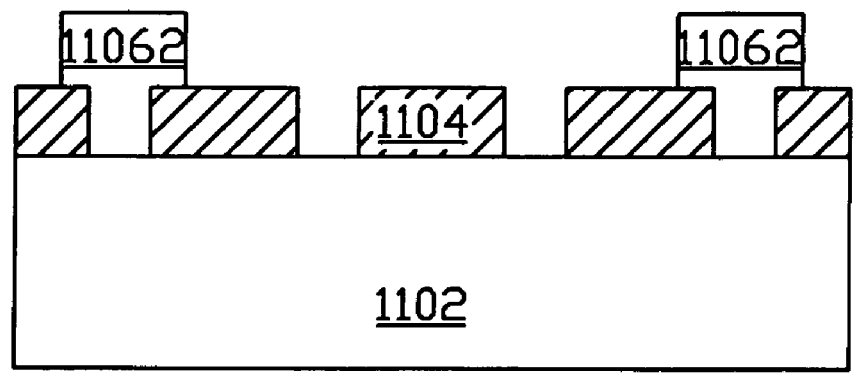
Figure 11E:
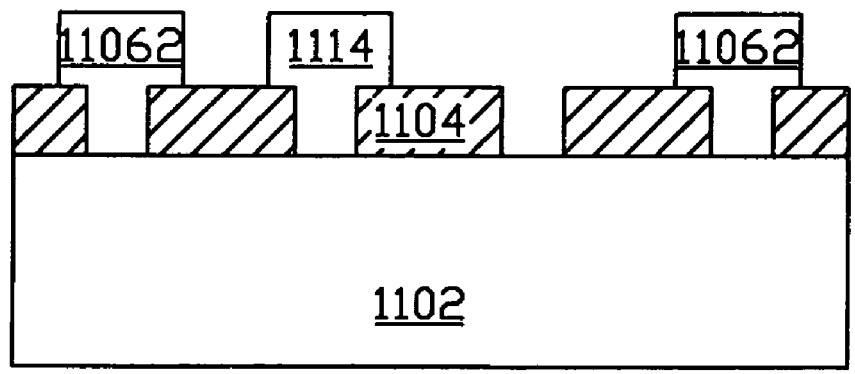
Figure 11F:
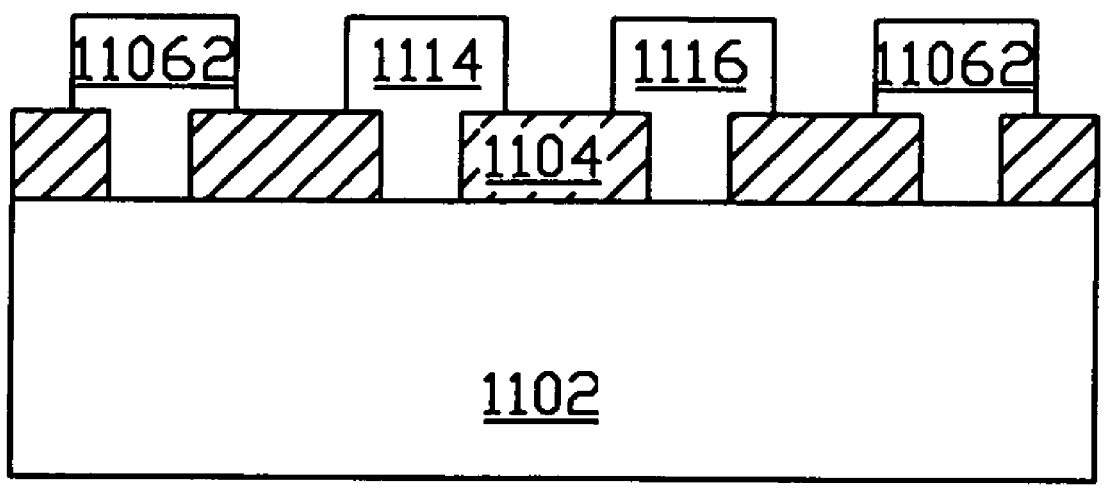

On the other hand, as shown in FIG. 10, the exposure area size E of the exposure light source can be controlled by adjusting the vertical distance h between platform 414 and the lens of the exposure scanner 402. In this embodiment, the vertical distance h between the platform 414 and the lens of the exposure scanner 402 is changed by the controller 428 drives the Z axis motor 420 to let the platform 414 move up and down in Z axis. If the vertical distance h between the platform 414 and lens 408 is large, the exposure area E of the exposure light source is become smaller, and the exposure energy is more and more small. At this time, the exposure energy can be maintained by the controller 428 to increase the UV light energy. Similarly, when the vertical h between the platform 414 and the lens 408 is small, the exposure area E of the exposure light source is become large, and the exposure energy is also become large. At this time, the exposure energy can be maintained by the controller 428 to decrease the UV light energy. According to abovementioned, the exposure range within the exposure light source per exposure area can be changed by the platform 414 which is shifted in Z axis direction. In one embodiment, the exposure range of the exposure light on the coloration photoresist layer can be changed by shifting the position which is lens 408 located in Z axis directly. In another embodiment, the exposure range is changed by the changing the lens with various focus distance.

The required size and shape of the exposure area for the coloration photoresist layer which can be designed through the appreciated exposure light path. The design of the exposure light path is accomplished through the normalized by each motor within the color filter fabricating apparatus. In this embodiment, the controlling operation of the each motor, the switch of the shutters, and the energy of the UV light source are controlled by the controller 428. Thus, normalization of the exposure light path can be displayed as program code that built in the storage unit of the controller 428. In one embodiment, the controller 428 can be a controller card, microprocessor, or hardware. Furthermore, the color filter fabricating apparatus 40 can integrate the present color filter fabrication equipment.

According to abovementioned, the FIG. 11 shows the fabricating steps for fabricating color filter. Firstly, as shown in FIG. 11A, a substrate plane 1102 includes a black matrix 1104 thereon, wherein the black matrix 1104 used to block the light. Then, as shown in FIG. 11B, a coloration photoresist layer such as red coloration photoresist layer is spun on the substrate plane 1102 and the black matrix 1104 to form a red coloration photoresist layer 1106. Next, as shown in FIG. 11C, the ON/OFF time of the plurality of exposure light sources of the exposure scanner is controlled by the high speed controlling; meanwhile, the platform shifted in X axis direction to perform line scan, such that the red coloration photoresist layer is exposed by the exposure light to form a desired pattern on the red coloration photoresist layer 1106, wherein the ON/OFF time of the plurality of exposure light source is controlled by the plurality of shutter switch 1110 of the exposure scanner. As shown in FIG. 11D, a development process is performed on the exposed red coloration photoresist layer 1106 to form a red coloration layer 11062. Then, another coloration photoresist layer such as green coloration photoresist layer is formed on the substrate plane 1102, the black matrix 1104, and the red coloration layer 11062, and the platform shifted horizontally in Y axis to a fit distance to another scanning position. That is to say, the relative position in Y axis between the substrate plane and the exposure scanner is to be changed, so as to let the exposure scanner can perform the line scan on the green coloration photoresist layer. Thus, as abovementioned for fabricating the red coloration layer 11062, the ON/OFF time of the exposure light source is controlled by the high speed exposure scanner, and the platform is driven to scan in X axis direction, such that the exposure light source can perform line scan on the green coloration photoresist layer to form a desired pattern. Then, a development process is performed on the exposed green coloration photoresist layer to form a green coloration layer 1114 on the substrate plane 1102 as shown in FIG. 11E. Similarly, repeating the fabricating step for the green coloration layer as abovementioned, the blue coloration layer 1116 can be formed on the substrate plane 11102 as shown in FIG. 11F. Thus, a color filter having three coloration layers can be obtained.

In conclusion, the present invention utilizes an exposure scanner to generate the plurality of exposure light source, and controls the ON/OFF time of the plurality of exposure light sources by high speed control shutter switch, so as to generate a relative motion between the plurality of exposure light sources and the substrate plane to perform an exposure scan the coloration photoresist layer which is on the substrate plane to form a desired pattern. Thus, the present invention did not utilize the cost for fabricating the mask can be diminished, and the damage of the mask can be prevented. Moreover, the rotating operation color filter fabricating apparatus can process the different size and the shape for the substrate plane.

What are described above are only preferred embodiments of the present invention, which are not used to limit the claims of the present invention; as for the above description, professionals that are familiar with the present technical field are able to understand and put into practice, and therefore, the equivalent changes or modifications made within the spirit disclosed by the present invention should be included in the appended claims.

What is claimed is:

1. A method for fabricating a color filter, said method comprising:
    (a) providing a plurality of exposure light sources of an exposure scanner;
    (b) forming a first coloration photoresist layer on a substrate plane;
    (c) controlling ON/OFF time of said plurality of exposure light sources to generate a first relative motion between said substrate plane and said plurality of exposure light sources, so as to perform an exposing process without using a mask to said first coloration photoresist layer to form a required pattern with a plurality of intermittent first exposure areas corresponding to first color pixels on said first coloration photoresist layer;
    (d) performing a development process to said first coloration photoresist layer to form a first coloration layer on said substrate plane;
    (e) forming a second coloration photoresist layer on the substrate plane;
    (f) controlling said ON/ OFF time of said plurality of exposure light sources to generate a second relative motion between said plurality of exposure light sources and said substrate plane, so as to perform an exposing process without using a mask on said second coloration photoresist layer to form a required pattern with a plurality of intermittent second exposure areas corresponding to second color pixels on said second coloration photoresist layer;
    (g) performing a development process to form a second coloration layer on said substrate plane; and
    (h) repeating said step (e) to said step (g) to form a required plurality of coloration layers on said substrate plane.

2. The method according to claim 1, wherein said first relative motion and said second relative motion is a relative motion between said substrate plane and said plurality of exposure light sources in a horizontal direction, wherein said horizontal direction is paralleled to said substrate plane.

3. The method according to claim 1, wherein said plurality of exposure light sources is generated from a light source in said exposure scanner that passed through a plurality of shutter switches and a plurality of lenses, and said ON/OFF time of said plurality of light sources is controlled by operating a ON/OFF of said plurality of shutter switches.

4. The method according to claim 3, further comprising changing a vertical distance between said plurality of lenses of said exposure scanner to adjust the exposure area of each said exposure light source of said plurality of exposure light sources on said first coloration photoresist layer.

5. The method according to claim 4, wherein said changing said vertical distance is performed by changing a position of said substrate plane or a position of said exposure scanner on said vertical direction position, wherein said vertical direction is perpendicular to said substrate plane.

6. The method according to claim 4, wherein said changing said vertical distance is performed by changing a position of said plurality of lenses on said vertical direction, wherein said vertical direction is perpendicular to said substrate plane.

7. The method according to claim 1, wherein said relative motion is generated between said substrate plane and said exposure light sources by fixing said exposure scanner and moving said substrate plane.

8. The method according to claim 1, wherein said relative motion is generated between said substrate plane and said exposure light sources by fixing said substrate plane and moving said exposure scanner.

9. The method according to claim 1, wherein said plurality of exposure light sources arranged to a row.

10. The method according to claim 1, further comprising adjusting an interval between each said exposure light source of said plurality of exposure light sources to change an interval between each said exposure area on a coloration photoresist layer during said exposure process.

11. The method according to claim 1, wherein said plurality of exposure light sources arrayed to a row, and an interval between each said exposure light source is fixed.

12. The method according to claim 11, further comprising rotating said exposure scanner on said substrate plane to a presetting position to change an interval between an exposure area of each said exposing process before performing said exposing process.

13. The method according to claim 1, wherein said substrate plane having a black matrix thereon, and said first coloration photoresist layer is formed on said substrate plane and said black matrix.

14. A method for fabricating a color filter, said method comprising:
    (a) providing a plurality of exposure light sources of an exposure scanner, said plurality of exposure light sources arranged to a row;
    (b) forming a first coloration photoresist layer on said substrate plane;
    (c) controlling an ON/OFF time of said plurality of exposure light sources, and generating a relative motion between said substrate plane and said plurality of exposure light sources in X axis direction to perform an exposing process without using a mask on said first coloration photoresist layer to form a required pattern with a plurality of intermittent first exposure areas corresponding to first color pixels on said first coloration photoresist layer;
    (d) performing a development process on said first coloration photoresist layer to form a first coloration layer on said substrate plane;
    (e) changing a relative position between said substrate plane and said plurality of exposure light sources in Y axis direction, wherein said X axis direction is perpendicular to said Y axis direction, and said X axis direction and said Y axis direction are paralleled to said substrate plane;
    (f) forming a second coloration photoresist layer on said substrate plane and said first coloration layer;
    (g) controlling an ON/OFF time of said plurality of exposure light sources, and generating a second relative motion between said substrate plane and said plurality of exposure light sources to perform an exposing process without using a mask to form a required pattern with a plurality of intermittent second exposure areas corresponding to second color pixels on said second coloration photoresist layer;

(h) performing a development process to said second coloration photoresist layer to form a second coloration layer on said substrate plane;

(i) repeating said step (f) to said step (h) to form said plurality of color layers on said substrate plane.

15. The method according to claim 14, wherein said plurality of exposure light sources is generated from a light source of said exposure scanner, and passed through a plurality of shutter switches and a plurality of lenses, wherein said controlling said ON/OFF time of said plurality of said exposure light sources by controlling said ON/OFF time of said plurality of shutter switches.

16. The method according to claim 15, further comprising a vertical distance between said plurality of lenses and said substrate plane of said exposure scanner in Z axis direction to adjust an exposed area of each of said plurality of exposure light sources on said first coloration photoresist layer, wherein said Z axis direction is perpendicular to said X axis and said Y axis direction respectively.

17. The method according to claim 16, wherein said changing said vertical distance in said Z axis direction between said plurality of lenses of said exposure scanner and said substrate plane is performed by fixing said exposure scanner and changing a position in said Z axis direction of said substrate plane.

18. The method according to claim 17, wherein said changing said vertical distance in said Z axis direction between said plurality of lenses of said exposure scanner and said substrate plane is performed by fixing a position of said substrate plane and changing said exposure scanner in said Z axis direction.

19. The method according to claim 14, wherein said relative motion between said substrate plane and said plurality of exposure light sources in said X axis direction is performed by fixing said exposure scanner and moving said substrate plane.

20. The method according to claim 19, wherein said relative motion between said substrate plane and said plurality of exposure light sources in said X axis direction is performed by fixing said substrate plane and moving said exposure scanner.

21. The method according to claim 19, further comprising adjusting an interval between each said plurality of exposure light sources of each exposed area of said each said plurality of exposure light sources on said first coloration photoresist layer in said Y axis direction.

22. The method according to claim 19, wherein said interval between each of said plurality of exposure light sources is fixed.

23. The method according to claim 22, further comprising rotating said exposure scanner and rotating said substrate plane to a presetting location to change an interval of said exposed area on said first coloration photoresist layer in said Y axis direction.

24. The method according to claim 14, wherein said substrate plane having a black matrix thereon, and said coloration photoresist layer is formed on said substrate plane and said black matrix.

* * * * *